US012677566B2

(12) United States Patent
Hamasaki

(10) Patent No.: US 12,677,566 B2
(45) Date of Patent: Jul. 7, 2026

(54) ELECTRONIC MODULE INCLUDING FRAME MEMBER FRAME WITH TRANSMISSIVE MEMBER SUPPORT PORTION

(71) Applicant: CANON KABUSHIKI KAISHA, Tokyo (JP)

(72) Inventor: Satoru Hamasaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 487 days.

(21) Appl. No.: 18/200,628

(22) Filed: May 23, 2023

(65) Prior Publication Data

US 2023/0397475 A1     Dec. 7, 2023

(30) Foreign Application Priority Data

Jun. 2, 2022     (JP) ................................. 2022-090384
Dec. 20, 2022     (JP) ................................. 2022-203533

(51) Int. Cl.
H10K 59/80 (2023.01)
H10K 59/12 (2023.01)

(52) U.S. Cl.
CPC ........... H10K 59/872 (2023.02); H10K 59/12 (2023.02)

(58) Field of Classification Search
CPC .............................. H10K 59/872; G06F 1/1637
See application file for complete search history.

(56) References Cited

U.S. PATENT DOCUMENTS

| | | | |
|---|---|---|---|
| 9,679,930 B2 | 6/2017 | Hori | |
| 9,866,735 B2 | 1/2018 | Mitarai | |
| 10,043,839 B2 | 8/2018 | Hori | |
| 10,396,112 B2 | 8/2019 | Hori | |
| 2015/0048240 A1 | 2/2015 | Hori | |
| 2015/0172519 A1 | 6/2015 | Mitarai et al. | |
| 2017/0168621 A1* | 6/2017 | Jo | H05K 5/0247 |
| 2017/0256578 A1 | 9/2017 | Hori | |
| 2018/0088736 A1* | 3/2018 | Jeong | H10K 59/40 |

(Continued)

FOREIGN PATENT DOCUMENTS

| | | |
|---|---|---|
| JP | 2004-349463 A | 12/2004 |
| JP | 2013-192207 A | 9/2013 |

(Continued)

*Primary Examiner* — Chad M Dicke
*Assistant Examiner* — Jeremy Daniel Watts
(74) *Attorney, Agent, or Firm* — Venable LLP

(57) ABSTRACT

An electronic module including an electronic device including a pixel region, a transmissive member including a main surface facing the pixel region, and a frame member coupled to the electronic device and the transmissive member and deciding a positional relationship between the electronic device and the transmissive member is provided. The frame member includes a support portion arranged to surround the transmissive member and having a support surface that supports the transmissive member. The support surface includes a contact portion contacting the main surface, and a concave portion which is depressed more than the contact portion and in which a coupling member configured to couple the transmissive member and the frame member is arranged. The contact portion includes, between the concave portion and an inner edge of the support surface, a portion extending along an outer edge of the main surface.

17 Claims, 11 Drawing Sheets

(56) References Cited

U.S. PATENT DOCUMENTS

| | | | |
|---|---|---|---|
| 2018/0308887 A1 | 10/2018 | Hori | |
| 2019/0072997 A1* | 3/2019 | Cha | G06F 1/1643 |
| 2019/0294213 A1 | 9/2019 | Katase et al. | |
| 2021/0168231 A1* | 6/2021 | Baker | H05K 1/189 |

FOREIGN PATENT DOCUMENTS

| | | | |
|---|---|---|---|
| JP | 2014-103170 A | 6/2014 | |
| JP | 2015-038920 A | 2/2015 | |

* cited by examiner

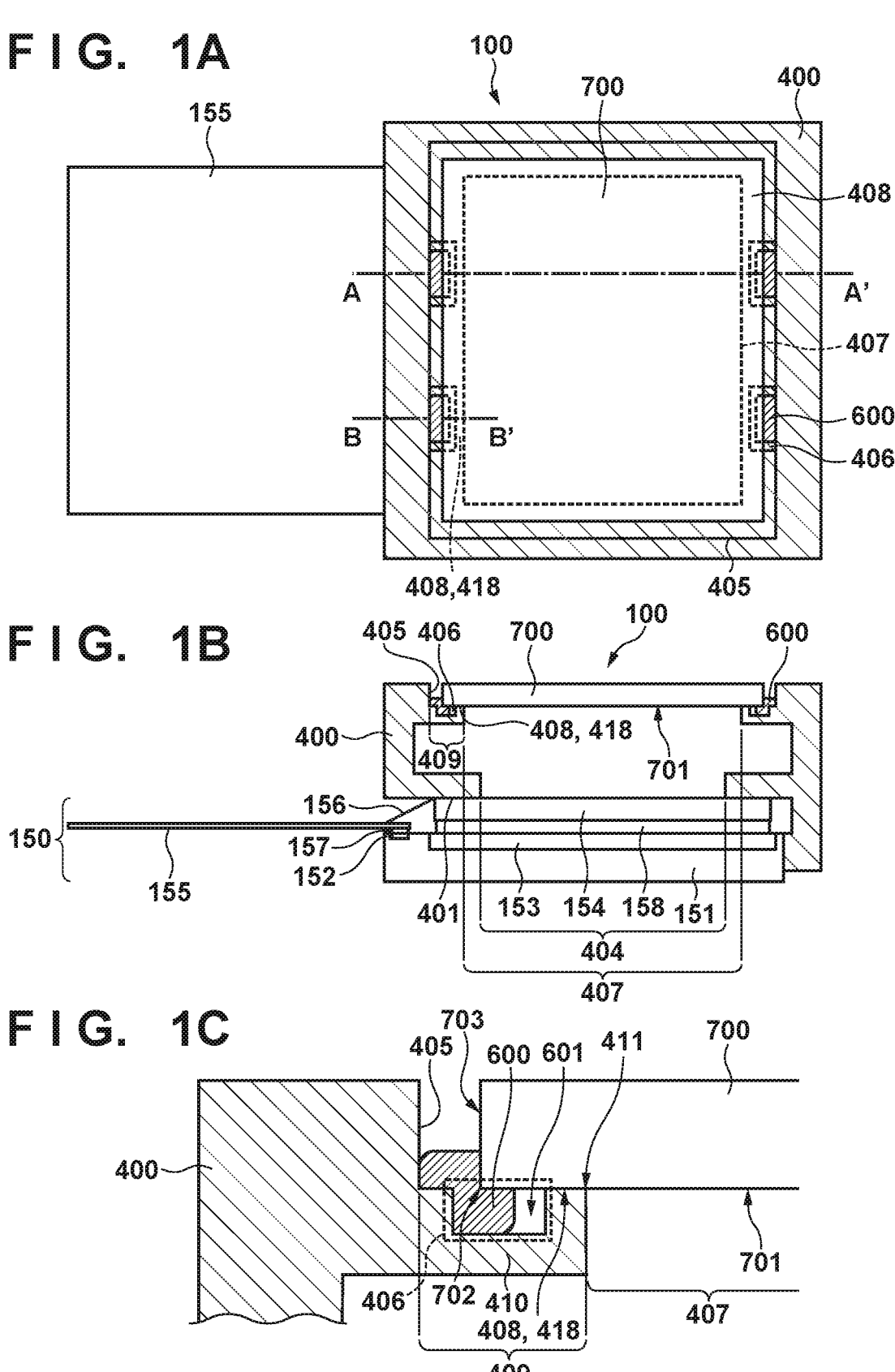
F I G. 1A
F I G. 1B
F I G. 1C

F I G.  2A
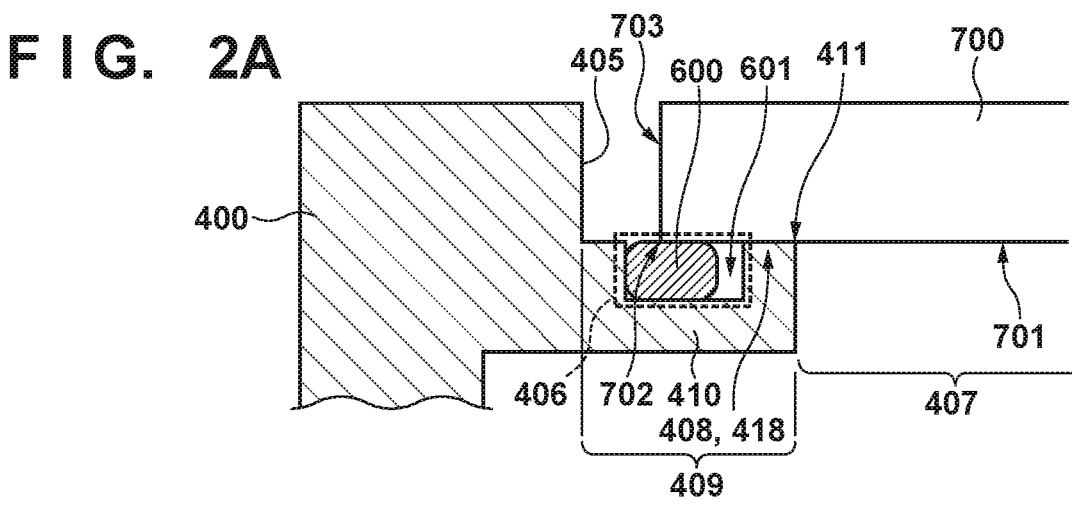
F I G.  2B
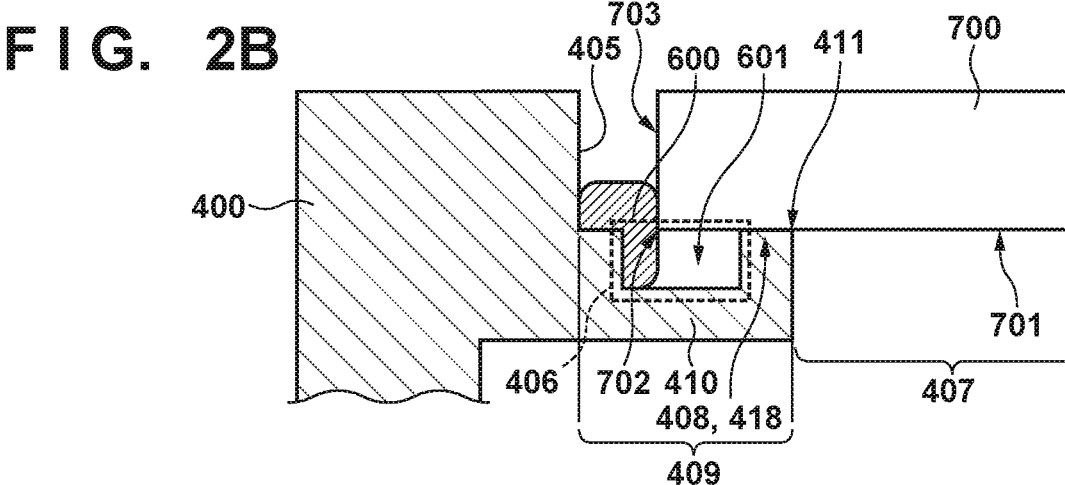
F I G.  2C
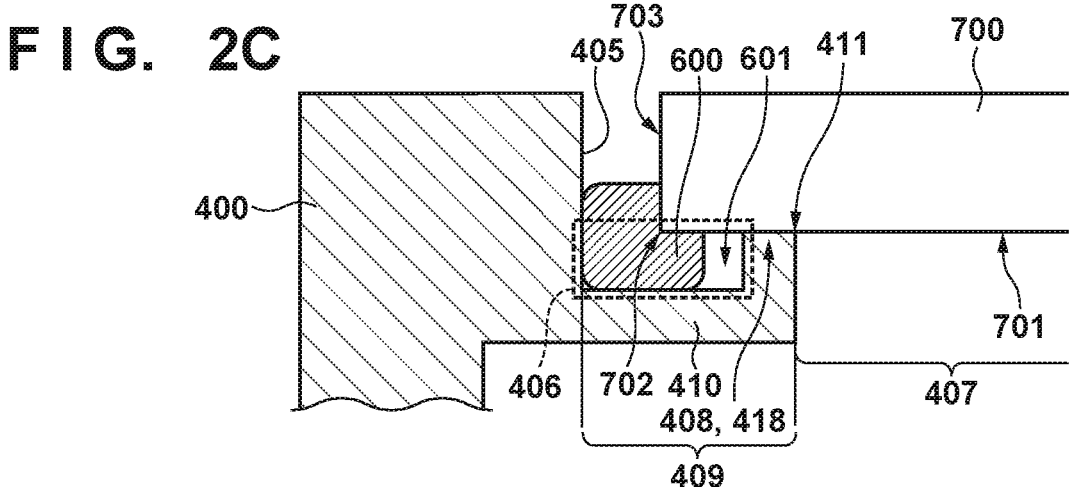

F I G.  3A
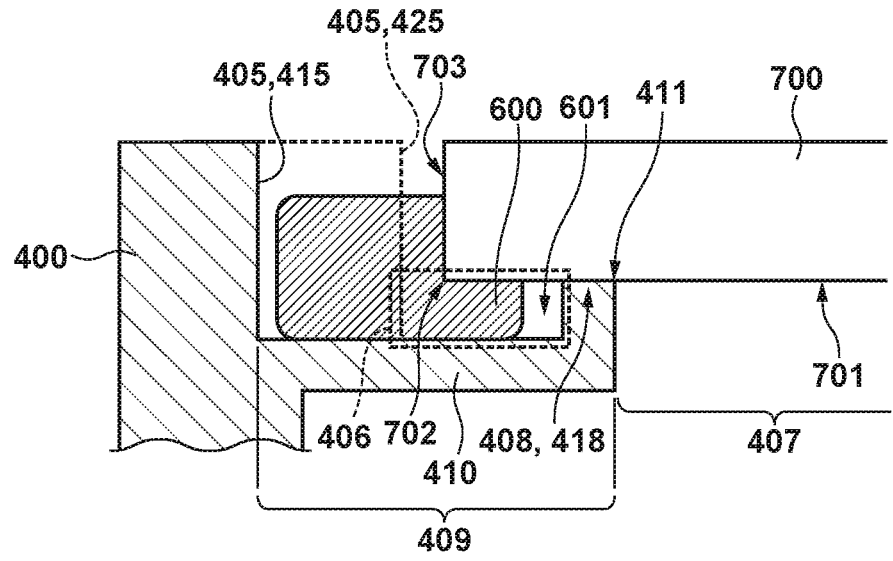
F I G.  3B

F I G. 4

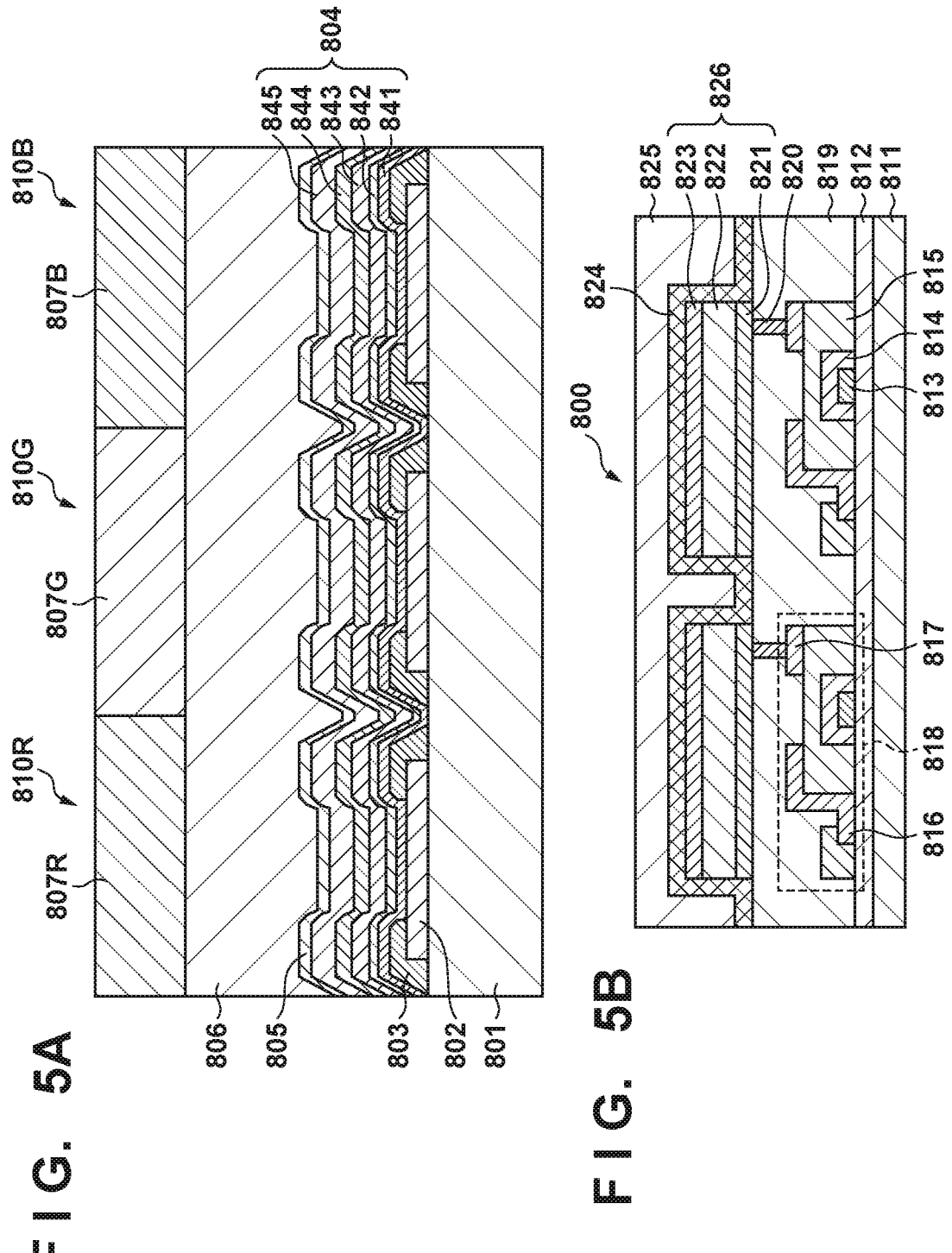
F I G. 5A
F I G. 5B

F I G.  10A
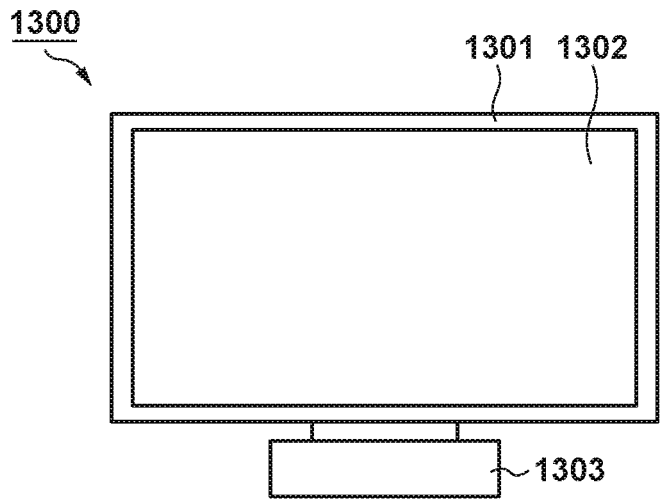
F I G.  10B
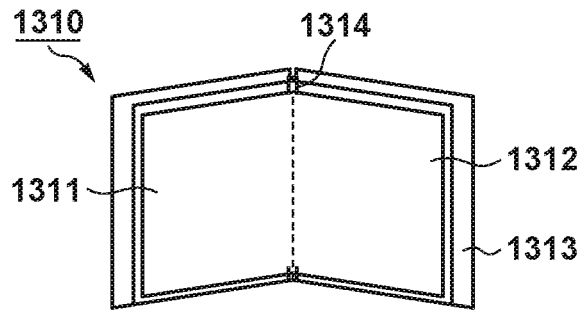

1405
1404
1403
1402
1401
1400

1503
1500
1502
1501

F I G. 13A
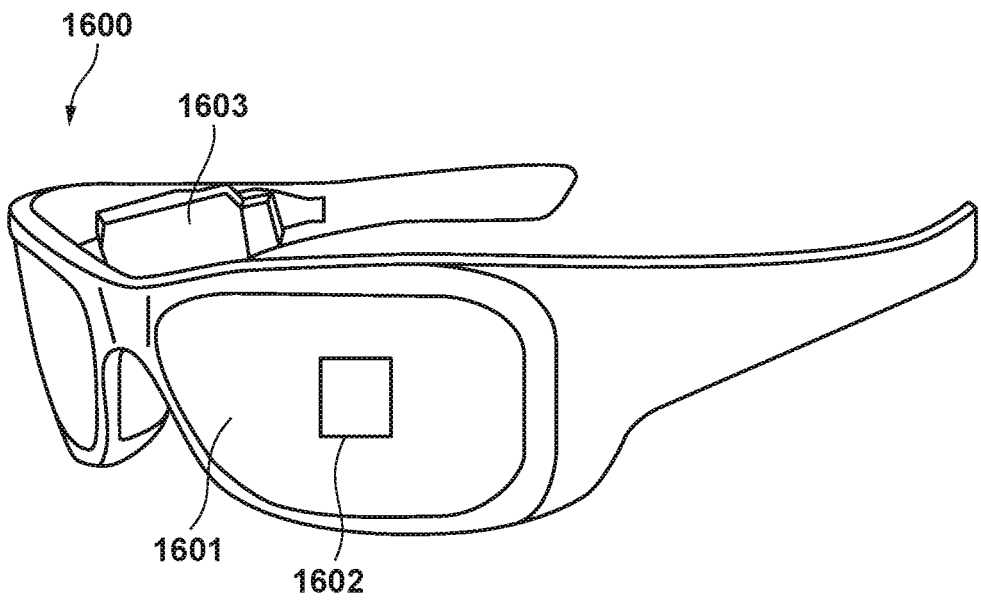
F I G. 13B
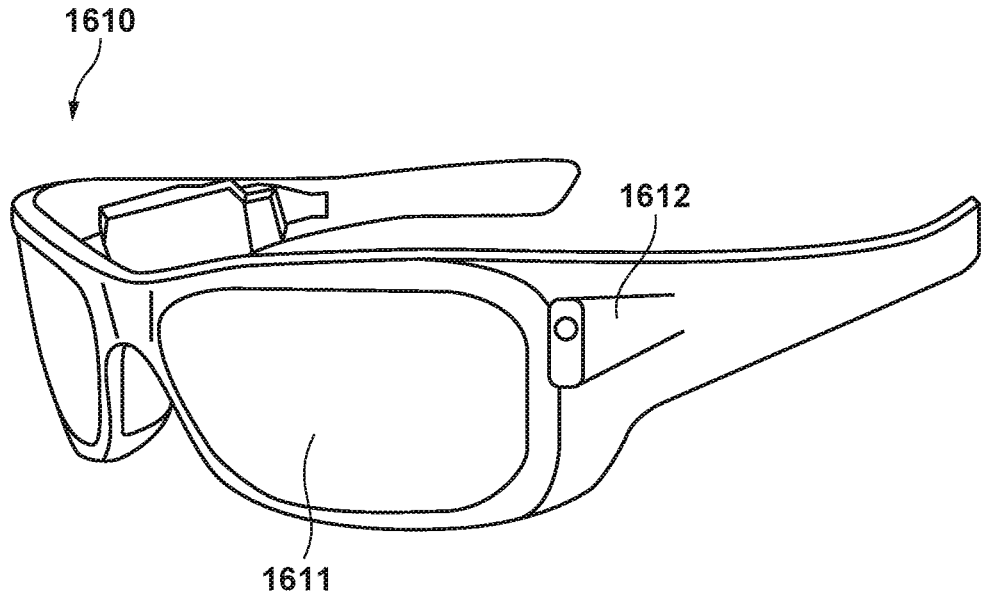

ELECTRONIC MODULE INCLUDING FRAME MEMBER FRAME WITH TRANSMISSIVE MEMBER SUPPORT PORTION

BACKGROUND OF THE INVENTION

Field of the invention

The present invention relates to an electronic module, a display device, a photoelectric conversion device, and an electronic apparatus.

Description of the Related Art

There is known an electronic module including an electronic device in which a photoelectric conversion element, a light emitting element, and the like are arranged, a transmissive member for protecting the electronic device from water, a foreign substance, or the like, and a frame member that supports the transmissive member. Japanese patent Laid-Open No. 2015-038920 describes a technique of protecting the light receiving surface of an image sensor by providing a mold on the sides of a substrate on which the image sensor is placed and adhering glass to the mold.

SUMMARY OF THE INVENTION

If, when adhering glass to a mold, an adhesive leaks and spreads on the glass, a fault such as the adhesive being included in an image may occur. To suppress the spread of the adhesive, it is necessary to adjust the coating amount, curing condition, viscosity, and the like of the adhesive, thereby complicating the design and manufacturing of an electronic module.

Some embodiments of the present invention provide a technique advantageous in coupling a transmissive member and a frame member.

According to some embodiments, an electronic module comprising: an electronic device including a pixel region where a plurality of pixels are arranged; a transmissive member including a main surface facing the pixel region; and a frame member coupled to each of the electronic device and the transmissive member and configured to decide a positional relationship between the electronic device and the transmissive member, wherein the frame member comprises a support portion arranged to surround the transmissive member and having a support surface that supports the transmissive member, the support surface comprises a contact portion contacting the main surface, and a concave portion which is depressed more than the contact portion and in which a coupling member configured to couple the transmissive member and the frame member is arranged, and the contact portion comprises, between the concave portion and an inner edge of the support surface, a portion extending along an outer edge of the main surface is provided.

Further features of the present invention will become apparent from the following description of exemplary embodiments (with reference to the attached drawings).

BRIEF DESCRIPTION OF THE DRAWINGS

FIGS. 1A and 1B are a plan view and a sectional view showing an example of the arrangement of an electronic module according to an embodiment;

FIG. 1C is a sectional view of a support portion;

FIGS. 2A to 2C are sectional views each showing a modification of the support portion shown in FIG. 1C;

FIG. 3A is a plan view showing a modification of the electronic module shown in FIG. 1A;

FIG. 3B is a sectional view showing a modification of the support portion shown in FIG. 1C;

FIG. 4 is a sectional view of a support portion of a electronic module according to a comparative example;

FIGS. 5A and 5B are views showing an example of the arrangement of a pixel of the electronic module according to the embodiment;

FIG. 7 is a view showing an example of a display device using the electronic module according to the embodiment;

FIGS. 10A and 10B are views each showing an example of a display device using the electronic module according to the embodiment;

FIGS. 13A and 13B are views each showing an example of a wearable device using the electronic module according to the embodiment.

DESCRIPTION OF THE EMBODIMENTS

Figure 6A:
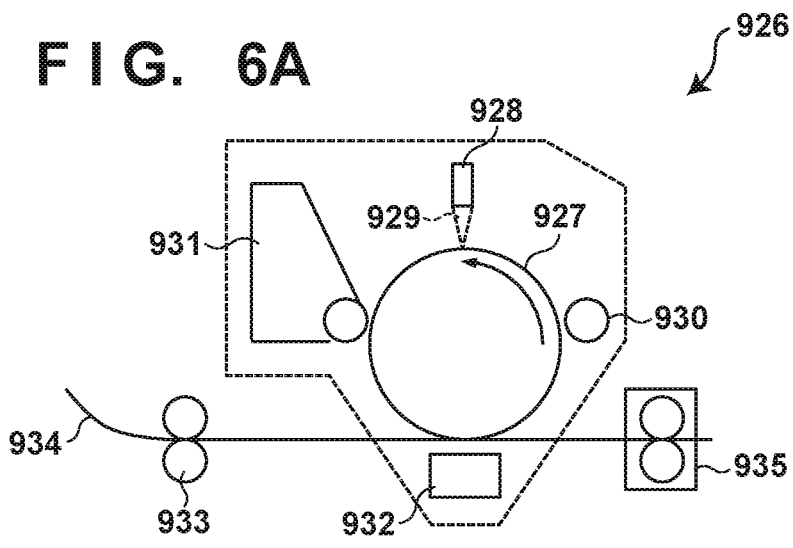
FIGS. 6A to 6C are views showing an example of an image forming device using the electronic module according to the embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 4:
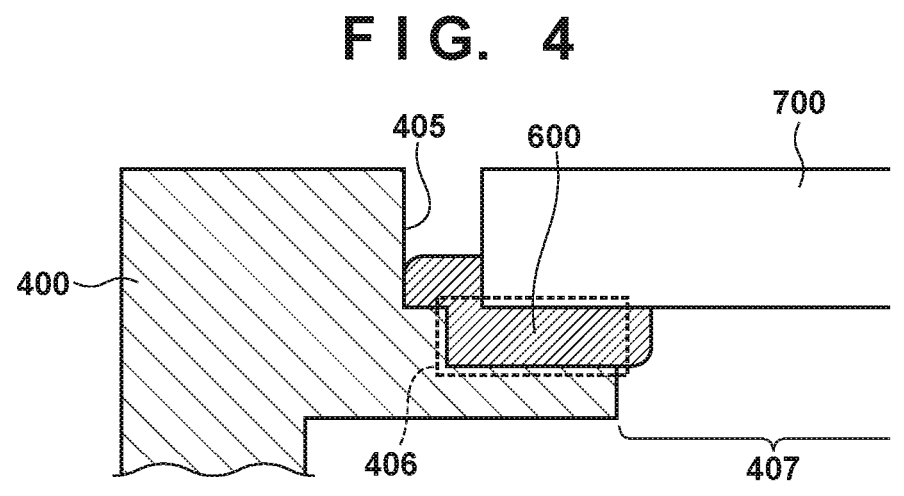

An electronic module according to an embodiment of the present disclosure will be described with reference to FIGS. 1A to 1C to 4. FIGS. 1A to 1C are schematic views for explaining an example of the arrangement of an electronic module 100 according to the present disclosure. FIG. 1A is a plan view when viewed from the side of a transmissive member 700 of the electronic module 100. FIG. 1B is a sectional view taken along a line A-A' in FIG. 1A. FIG. 1C is a sectional view taken along a line B-B' in FIG. 1A, and is an enlarged view for explaining details of a support portion 410 of a frame member 400.

First, the schematic arrangement of the electronic module 100 according to this embodiment will be described with reference to FIGS. 1A and 1B. The electronic module 100 includes an electronic device 150, the frame member 400, and a transmissive member 700. The electronic device 150 includes a substrate 151, a substrate 154, and a board 155. For the substrate 151, silicon, glass, a resin, or the like is used. The main surface of the substrate 151 is divided into a pixel region 153 where a plurality of pixels are arranged and a peripheral region, outside the pixel region 153, where an electrode 152 as an external connection terminal is arranged. The main surface of the substrate, on which the pixel region 153 is arranged, is arranged to face the transmissive member 700, as shown in FIG. 1A.

Each of the pixels arranged in the pixel region 153 may include a photoelectric conversion element. In this case, the electronic device 150 can also be called a photoelectric conversion device. Furthermore, each of the pixels arranged in the pixel region 153 may include a light emitting element. In this case, the electronic device 150 can also be called a light emitting device. If each pixel arranged in the pixel region 153 includes a light emitting element, the light emitting element may be a self-light emitting element using an organic light emitting material or inorganic light emitting material. For example, the light emitting element may be an organic electroluminescence (EL) element. A pixel including a photoelectric conversion element and a pixel including a light emitting element may be arranged in the pixel region 153. The following description assumes that each of the pixels arranged in the pixel region 153 includes a light emitting element such as an organic EL element and the electronic device 150 is a light emitting device.

The substrate 154 is arranged to face the main surface of the substrate 151, on which the pixel region 153 is arranged. A filling member 158 is arranged between the substrates 151 and 154, and the substrates 151 and 154 are coupled. As the substrate 154, a transmissive substrate made of glass or a resin can be used. For example, if the pixel arranged in the pixel region 153 includes a photoelectric conversion element, the substrate 154 transmits light to which the photoelectric conversion element has sensitivity. Alternatively, for example, if the pixel arranged in the pixel region 153 includes a light emitting element, the substrate 154 transmits light emitted by the light emitting element. To protect the pixel region 153, the substrate 154 is arranged to cover the pixel region 153 of the substrate 151.

The filling member 158 may be made of transparent epoxy resin or acrylic resin. The filling member 158 is arranged not to extend to the outside of the substrate 151 or the electrode 152. In the arrangement shown in FIGS. 1A to 1C, the filling member 158 entirely contacts the pixel region 153 of the substrate 151 and the main surface of the substrate 154 on the side of the substrate 151. However, the present disclosure is not limited to this, and for example, the filling member 158 need not contact the entire pixel region 153 or the entire surface of the substrate 154, and may contact only the four corners of the pixel region 153 or the substrate 154.

The board 155 is electrically connected to the electrode 152 of the substrate 151 via a bonding member 157. The board 155 can be, for example, a printed circuit board obtained by forming a wiring pattern on a rigid board such as a glass epoxy board or a composite board. For example, the board 155 may be a flexible wiring board with a wiring pattern formed in a flexible film of polyimide or the like. Furthermore, the board 155 may be a rigid flexible wiring board obtained by combining a flexible film and a rigid board. The board 155 can be used to supply electric power from the outside of the electronic device 150 to the substrate 151, The board 155 can be used to input a signal from the outside of the electronic device 150 to the substrate 151 and to output a signal from the substrate 151 to the outside of the electronic device 151).

As the bonding member 157, a bump, an anisotropic conductive Min, an anisotropic conductive paste, or the like can be used. If a bump is used as the bonding member 157, the electrode 152 of the substrate 151 and the wiring pattern arranged on the board 155 can electrically be connected by ultrasound or heating and pressurizing. If an anisotropic conductive film or an anisotropic conductive paste is used as the bonding member 157, the electrode 152 of the substrate 151 and the wiring pattern arranged on the board 155 can electrically be connected by heating and pressurizing.

As a reinforcing member 156, an ultraviolet curing adhesive, a thermosetting adhesive, or the like can be used. To improve the bonding strength between the substrate 151 and the board 155, the reinforcing member 156 is arranged to contact the main surface of the substrate 151, on which the pixel region 153 is arranged, the main surface of the board 155, opposite to the substrate 151, the periphery of the bonding member 157, and the like.

The frame member 400 and the transmissive member 700 are attached to the electronic device 150 for protection against an impact from the outside or for preventing entering of particles and the like from the outside, thereby forming the electronic module 100. The frame member 400 is coupled to each of the transmissive member 700 and the electronic device 150 including the pixel region 153 where the plurality of pixels are arranged on the substrate 151, thereby deciding the positional relationship between the electronic device 150 and the transmissive member 700. For example, the main surface of the substrate 154 facing the transmissive member 700 and an inner wall portion 401 of the frame member 400 continuously contact each other on the periphery of an opening portion 404 for exposing the pixel region 153. Furthermore, the transmissive member 700 including a main surface 701 facing the pixel region 153 is coupled to the frame member 400 by a coupling member 600 such as an adhesive, thereby suppressing entering of particles and the like from the outside. Coupling between the transmissive member 700 and the frame member 400 will be described later. For example, the electronic device 150 and the frame member 400 may be coupled using a coupling member such as an adhesive or using a snap structure or the like.

As the transmissive member 700, a transmissive member made of glass or a resin is used. For example, if the pixel arranged in the pixel region 153 includes a photoelectric conversion element, the transmissive member 700 transmits light to which the photoelectric conversion element has sensitivity. Alternatively, for example, if the pixel arranged in the pixel region 153 includes a light emitting element, the transmissive member 700 transmits light emitted by the light emitting element.

Coupling between the transmissive member 700 and the frame member 400 will be described next with reference to FIGS. 1A to 1C.

The frame member 400 can be formed by a resin material such as modified polyphenylene ether (PPE), liquid crystal polymer (LCP), or polyamide. The opening portion 404 is provided in the frame member 400 in accordance with the pixel region 153. The frame member 400 includes a wall portion 405 arranged to surround the transmissive member 700, and the support portion 410 including a support surface 409 that supports the transmissive member 700. The support surface 409 includes a contact portion 408 contacting the main surface 701 of the transmissive member 700, and a concave portion 406 which is depressed more than the contact portion 408 and in which the coupling member 600 that couples the transmissive member 700 and the frame member 400 is arranged. In this example, the contact portion 408 includes, between the concave portion 406 and an inner edge 411 of the support surface 409, a portion 418 extending along an outer edge 702 of the main surface 701 of the transmissive member 700. As shown in FIG. 1C, a space 601 surrounded by the wall surface of the concave portion 406, the coupling member 600, and the transmissive member 700 can be formed in the concave portion 406. The wall surface of the concave portion 406 includes a side wall arranged along the depth direction of the concave portion 406 and a bottom surface of the concave portion 406, arranged to face the transmissive member 700.

FIG. 4 is a view showing a support portion 410 according to a comparative example. In the support portion 410 of the comparative example, a contact portion 408 contacting a main surface 701 of a transmissive member 700 does not include, between a concave portion 406 and an inner edge 411 of a support surface 409, a portion 418 extending along an outer edge 702 of the main surface 701 of the transmissive member 700. In this case, as shown in FIG. 4, when coupling the transmissive member 700 and a frame member 400 via a coupling member 600, the coupling member 600 using an adhesive or the like may leak and spread to a region of an opening portion 407 of the frame member 400 on the main surface 701 of the transmissive member 700. In this case, light emitted by a pixel arranged in a pixel region 153 is reflected or refracted by the coupling member 600 thereby degrading the display quality of an image displayed on the pixel region 153.

On the other hand, in this embodiment, in the support portion 410, the contact portion 408 (portion 418) contacting the main surface 701 of the transmissive member 700 is arranged between the concave portion 406 and the inner edge 411 of the support surface 409. The space 601 and the portion 418 of the contact portion 408 can suppress the spread of the coupling member 600 inside the concave portion 406 (the side of the inner edge 411) when coupling the transmissive member 700 and the frame member 400 via the coupling member 600. As a result, it is possible to suppress deterioration of image quality caused by the leakage and spread of the coupling member, as shown in FIG. 4. Furthermore, even if the coating amount, curing condition, viscosity, and the like of the coupling member 600 vary, the space 601 and the portion 418 of the contact portion 408 suppress the leakage and spread of the coupling member 600. That is, it is possible to suppress complication of the design and manufacturing of the electronic module 100.

From the viewpoint of the filling property of the coupling member 600, the concave portion 406 may have a depth of 50 μm or more from the contact portion 408. As the coupling member 600, fix example, an ultraviolet curing adhesive such as epoxy resin or acrylic resin or the like can be used.

For example, the following processes may be used to couple the transmissive member 700 and the frame member 400. The transmissive member 700 is arranged on the support surface 409 of the support portion 410 while the position of the transmissive member 700 is regulated by the wall portion 405 of the frame member 400, and an adhesive as the coupling member 600 is coated to the concave portion 406 formed in the frame member 400. Therefore, as shown in FIG. 1A, if the transmissive member 700 is arranged to cover part of the concave portion 406 in orthogonal projection to the support surface 409, the adhesive as the coupling member 600 can readily be coated. After that, the adhesive is cured to couple the transmissive member 700 and the frame member 400 via the coupling member 600.

In orthogonal projection to the support surface 409, the whole concave portion 406 is separated from the inner edge 411 of the support surface 409. Thus, the contact portion 408 (portion 418) contacting the main surface 701 of the transmissive member 700 can be arranged between the concave portion 406 and the inner edge 411 of the support surface 409. Furthermore, as shown in FIGS. 1A to 1C, in orthogonal projection to the support surface 409, the contact portion 408 may be arranged continuously to surround the inner edge 411 of the support surface 409. If the contact portion 408 is arranged continuously to surround the inner edge 411 of the support surface 409, the transmissive member 700 can be supported stably.

As shown in FIG. 1A, a plurality of concave portions 406 are arranged on the support surface 409. The number of arranged concave portions 406 may he four as shown in FIG. 1A, three or less, or five or more in accordance with the weight of the transmissive member 700. the coupling force between the transmissive member 700 and the frame member 400 via the coupling member 600, and the like. In addition, the concave portions 406 are not limited to the intermittent arrangement. For example, one concave portion 406 may continuously be arranged to correspond to one side of the inner edge 411 of the support surface 409. Alternatively, for example, the concave portion 406 may continuously surround the whole circumference of the inner edge 411 of the support surface 409.

In the arrangement shown in FIGS. 1B and 1C, the coupling member 600 contacts the main surface 701 of the transmissive member 700 and a side surface 703 extending in a direction intersecting the main surface 701 of the transmissive member 700. However, the arrangement of the coupling member 600 is not limited to this. Modifications of the arrangement of the coupling member 600 will be described with reference to FIGS. 2A and 2B, As shown in FIG. 2A, the coupling member 600 may contact the main surface 701 of the transmissive member 700 and may not contact the side surface 703. As shown in FIG. 2B, the coupling member 600 may contact the side surface 703 of the transmissive member 700 and may not contact the main surface 701, if, for example, the transmissive member 700 and the frame member 400 can be coupled by a small amount of the coupling member 600, the use amount of the coupling member 600 in the arrangement shown in FIG. 2A or 2B is smaller than in the arrangement shown in FIGS. 1B and 1C.

FIG. 2C is a view showing a modification of the support portion 410 shown in FIG. 1C. In the arrangement shown in FIGS. 1A to 1C, in orthogonal projection to the support surface 409, the whole concave portion 406 is arranged apart from the wall portion 405, arranged to surround the transmissive member 700, of the frame member 400. On the other hand, in the arrangement shown in FIG. 2C, in orthogonal projection to the support surface 409, the concave portion 406 contacts the wall portion 405, arranged to surround the transmissive member 700, of the frame member 400. In other words, part of the inner wall of the wall portion 405 of the frame member 400 forms part of the side wall of the concave portion 406. The inner wall of the wall portion 405 indicates a wall surface of the wall portion 405, which faces the transmissive member 700. Furthermore, as described above, the side wall of the concave portion 406 indicates a wall surface arranged along the depth direction of the concave portion 406.

In the arrangement shown in FIG. 2C, if the size of the support portion 410 is the same, the capacity of the concave portion 406 can be made larger than in the arrangement shown in FIG. 1C. Therefore, in the arrangement shown in FIG. 2C, the transmissive member 700 and the frame member 400 can be coupled using a large amount of the coupling member 600, as compared with the arrangement shown in FIG. 1C, thereby improving the coupling strength.

Even if a large amount of the coupling member 600 is used, the space 601 and the contact portion 408 (portion 418) contacting the main surface 701 of the transmissive member 700 are arranged between the concave portion 406 and the inner edge 411 of the support surface 409. Therefore, it is possible to suppress the leakage and spread of the coupling member 600 to the main surface 701 of the transmissive member 700.

A modification of the above-described electronic module 100 will be described next with reference to FIGS. 3A and 3B. FIG. 3A is a plan view when viewed from the side of the transmissive member 700 of the electronic module 100. FIG. 3B is a sectional view taken along a line C-C' in FIG. 3A, and is an enlarged view for explaining details of the support portion 410 of the frame member 400. As compared with each of the above-described embodiments, the shapes of the wall portion 405 and concave portion 406 of the frame member 400 are different. The remaining components may be similar to those in each of the above-described embodiments. Therefore, the different components will mainly be described and a description of the components that may be similar to the above embodiments will appropriately be omitted.

In the electronic module 100 shown in FIGS. 3A and 3B, in orthogonal projection to the support surface 409, a portion 415, contacting the concave portion 406, of the wall portion 405, arranged to surround the transmissive member 700, of the frame member 400 is depressed toward the outer edge of the frame member 400 more than a portion 425, not contacting the concave portion 406, of the wall portion 405. In other words, the inner wall of the wall portion 405 is depressed more than the remaining portion 425 in the portion 415, forming part of the side wall of the concave portion 406, of the inner wall of the wall portion 405.

In the above-described process of coupling the transmissive member 700 and the frame member 400, a tube called a needle is generally often used to supply the coupling member 600. In this case, a needle having a larger diameter is used for the purpose of increasing the supply amount per unit time to improve the yield cycle time. However, if the diameter of the needle is simply increased, the possibility that the needle contacts the transmissive member 700 or the frame member 400 to damage the transmissive member 700 or the frame member 400 is increased. In the arrangement shown in FIGS. 3A and 3B, the portion 415, forming part of the side wall of the concave portion 406, of the inner wall of the wall portion 405 is depressed more than the remaining portion 425. That is, in a place where the concave portion 406 is arranged, a distance between the transmissive member 700 and the wall portion 405 of the frame member 400 can be taken. Thus, in the process of coupling the transmissive member 700 and the frame member 400, even if the diameter of the needle is increased, it is possible to perform such process design that damage to the transmissive member 700 or the frame member 400 can be suppressed and the yield cycle time can be improved.

Application examples in which the electronic module 100 of this embodiment is applied to an image forming device, a display device, a photoelectric conversion device, an electronic apparatus, an illumination device, a moving body, and a wearable device will be described here with reference to FIGS. 5 to 13A and 13B. As described above, assume that a light emitting element, especially, an organic light emitting element such as an organic EL element is arranged in the pixel arranged in the pixel region 153 of the substrate 151 of the electronic device 150, That is, a case where the electronic device 150 is a light emitting device (also called a light emitting apparatus) will be described. Details of the components in the pixel region 153 arranged in the electronic device 150 of the above-described electronic module 100 will be described first, and the application examples will be described after that.

Arrangement of Organic Light Emitting Element

The organic light emitting element is provided by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

Substrate

Quartz, glass, a silicon wafer, a resin, a metal, or the like may be used as a substrate. Furthermore, a switching element such as a transistor and a wiring may be provided on the substrate, and an insulating layer may be provided thereon. The insulating layer may be made of any material as long as a contact hole can be formed so that the wiring can be formed between the insulating layer and the first electrode and insulation from the unconnected wiring can be ensured, For example, a resin such as polyimide, silicon oxide, silicon nitride, or the like can be used.

Electrode

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a work function as large as possible may be used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

If the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. If the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function may be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multi-layer structure. Among others, silver may be used. To suppress aggregation of silver, a silver alloy is more suitable for use. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is suitable since the good film coverage is provided and the resistance is easily lowered.

Pixel Separation Layer

A pixel separation layer is formed by a silicon nitride (SiN) film, a silicon oxynitride (SiON) film, or a silicon oxide (SiO) film formed using a Chemical Vapor Deposition method (CVD method). To increase the resistance in the in-plane direction of the organic compound layer, the organic compound layer, especially the hole transport layer may be thinly deposited on the side wall of the pixel separation layer. More specifically, the organic compound layer can he deposited so as to have a thin film thickness on the side wall by increasing the taper angle of the side wall of the pixel separation layer or the film thickness of the pixel separation layer to increase vignetting during vapor deposition.

On the other hand, it may be to adjust the taper angle of the side wall of the pixel separation layer or the film thickness of the pixel separation layer to the extent that no space is formed in the protection layer formed on the pixel separation layer. Since no space is formed in the protection layer, it is possible to reduce generation of defects in the protection layer. Since generation of detects in the protection layer is reduced, a decrease in reliability caused by generation of a dark spot or occurrence of a conductive failure of the second electrode can be reduced.

According to this embodiment, even if the taper angle of the side wall of the pixel separation layer is not acute, it is possible to effectively suppress leakage of charges to an adjacent pixel. As a result of this consideration, it has been found that the taper angle of 60° (inclusive) to 90° (inclusive) can sufficiently reduce the occurrence of defects. The film thickness of the pixel separation layer is desirably 10 nm (inclusive) to 150 nm (inclusive). A similar effect can be obtained in an arrangement including only pixel electrodes without the pixel separation layer. However, in this case, the film thickness of the pixel electrode is set to be equal to or smaller than half the film thickness of the organic layer or the end portion of the pixel electrode is formed to have a forward tapered shape of less than 60° because short circuit of the organic light emitting element can be reduced.

Furthermore, in a case where the first electrode is the cathode and the second electrode is the anode, a high color gamut and low-voltage driving can be achieved by forming the electron transport material and charge transport layer and forming the light emitting layer on the charge transport layer.

10

Organic Compound Layer

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

Protection Layer

A protection layer may be provided on the cathode. Fax example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 μm by the CVD method. The protection layer may be provided using an atomic deposition method (ALD method) after deposition using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

Color Filter

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

Planarizing Layer

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material. However, a polymetric material is more suitable.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

Microlens

The organic light emitting device can include an optical member such as a microlens on the light emission side. The microlens can be made of acrylic resin, epoxy resin, or the like. The microlens can aim to increase the amount of light extracted from the organic light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircle of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

The microlens includes a first surface including a convex portion and a second surface opposite to the first surface. The second surface may be arranged on the functional layer side of the first surface. For this arrangement, the microlens needs to be formed on the light emitting device. If the functional layer is an organic layer, it is suitable to avoid a process which produces high temperature in the manufacturing step. In addition, if it is configured to arrange the second surface on the functional layer side of the first surface, all the glass transition temperatures of an organic compound forming the organic layer may be 100° C. or more, and more suitably 130° C. or more.

Counter Substrate

A counter substrate can be provided on the planarizing layer. The counter substrate is called a counter substrate because it is provided at a position corresponding to the above-described substrate. The constituent material of the counter substrate can be the same as that of the above-described substrate. If the above-described substrate is the first substrate, the counter substrate can be the second substrate.

Organic Layer

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Pixel Circuit

The light emitting device can include a pixel circuit connected to the light emitting element. The pixel circuit may be an active matrix circuit that individually controls light emission of the first and second light emitting elements. The active matrix circuit may be a voltage or current programing circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

Pixel

The organic light emitting device includes a plurality of pixels. Each pixel includes sub-pixels that emit light components of different colors. The sub-pixels include, for example, R, G, and B emission colors, respectively.

In each pixel, a region also called a pixel opening emits light. This region is the same as the first region. The pixel opening can have a size of 5 $\mu$m (inclusive) to 15 $\mu$m (inclusive). More specifically, the pixel opening can have a size of 11 $\mu$m, 9.5 $\mu$m, 7.4 $\mu$m, 6.4 $\mu$m, or the like.

A distance between the sub-pixels can be 10 $\mu$m or less, and can be, more specifically, 8 $\mu$m, 7.4 $\mu$m, or 6.4 $\mu$m.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle, as a matter of course. The shape of the sub-pixel and the pixel arrangement can be used in combination.

Application of Organic Light Emitting Element of Embodiment of Present Invention The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

More details will be described next with reference to the accompanying drawings. FIG. 5A shows an example of a pixel as a constituent element of the above-described pixel region 153. The pixel includes sub-pixels 810. The sub-pixels are divided into sub-pixels 810R, 810G, and 810B by emitted light components. The light emission colors may be discriminated by the wavelengths of light components emitted from the light emitting layers, or light emitted from each sub-pixel may be selectively transmitted or undergo color conversion by a color filter or the like. Each sub-pixel includes a reflective electrode 802 as the first electrode on an interlayer insulating layer 801, an insulating layer 803 covering the end of the reflective electrode 802, an organic compound layer 804 covering the first electrode and the insulating layer, a transparent electrode 805 as the second electrode, a protection layer 806, and a color filter 807.

The interlayer insulating layer 801 can include a transistor and a capacitive element arranged in the interlayer insulating layer 801 or a layer below it. The transistor and the first electrode can electrically be connected via a contact hole (not shown) or the like.

The insulating layer 803 is also called a bank or a pixel separation film. The insulating layer 803 covers the end of the first electrode, and is arranged to surround the first electrode. A portion where no insulating layer is arranged is in contact with the organic compound layer 804 to form a light emitting region.

The organic compound layer 804 includes a hole injection layer 841, a hole transport layer 842, a first light emitting layer 843, a second light emitting layer 844, and an electron transport layer 845.

The second electrode may be a transparent electrode, a reflective electrode, or a semi-transmissive electrode.

The protection layer 806 suppresses permeation of water into the organic compound layer. The protection layer is shown as a single layer but may include a plurality of layers. Each layer can be an inorganic compound layer or an organic compound layer.

The color filter 807 is divided into color filters 807R, 807G, and 807B by colors. The color filters can be formed on a planarizing film (not shown). A resin protection layer (not shown) can be provided on the color filters. The color filters can be formed on the protection layer 806. Alternatively, the color filters can be provided on the counter substrate such as a glass substrate, and then the substrate may be bonded.

A display device 800 (corresponding to the above-described electronic device 150) shown in FIG. 5B is provided with an organic light emitting element 826 and a TFT 818 as an example of a transistor. A substrate 811 of glass, silicon, or the like is provided and an insulating layer 812 is provided on the substrate 811. The active element such as the TFT 818 is arranged on the insulating layer, and a gate electrode 813, a gate insulating film 814, and a semiconductor layer 815 of the active element are arranged. The TFT 818 further includes the semiconductor layer 815, a drain electrode 816, and a source electrode 817. An insulating film 819 is provided on the TFT 818. The source electrode 817 and an anode 821 forming the organic light emitting element 826 are connected via a contact hole 820 formed in the insulating film.

Note that a method of electrically connecting the electrodes (anode and cathode) included in the organic light emitting element 826 and the electrodes (source electrode and drain electrode) included in the TFT is not limited to that shown in FIG. 5B. That is, one of the anode and cathode and one of the source electrode and drain electrode of the TFT are electrically connected. The TFT indicates a thin-film transistor.

In the display device 800 shown in FIG. 5B, an organic compound layer is illustrated as one layer. However, an organic compound layer 822 may include a plurality of layers. A first protection layer 824 and a second protection layer 825 are provided on a cathode 823 to suppress deterioration of the organic light emitting element.

A transistor is used as a switching element in the display device 800 shown in FIG. 5B but may be used as another switching element.

The transistor used in the display device 800 shown in FIG. 5B is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that a thin-film transistor is also called a TFT element.

The transistor included in the display device 800 shown in FIG. 5B may be formed in the substrate such as an Si substrate. Forming the transistor in the substrate means forming the transistor by processing the substrate such as a Si substrate. That is, when the transistor is included in the substrate, it can be considered that the substrate and the transistor are formed integrally.

The light emission luminance of the organic light emitting element according to this embodiment can be controlled by the TFT which is an example of a switching element, and the plurality of organic light emitting elements can be provided in a plane to display an image with the light emission luminances of the respective elements. Note that the switching element according to this embodiment is not limited to the TFT, and may be a transistor formed from low-temperature polysilicon or an active matrix driver formed on the substrate such as an Si substrate. The term "on the substrate" may mean "in the substrate". Whether to provide a transistor in the substrate or use a TFT is selected based on the size of the display unit. For example, if the size is about 0.5 inch, the organic light emitting element may be provided on the Si substrate.

Figure 6B:
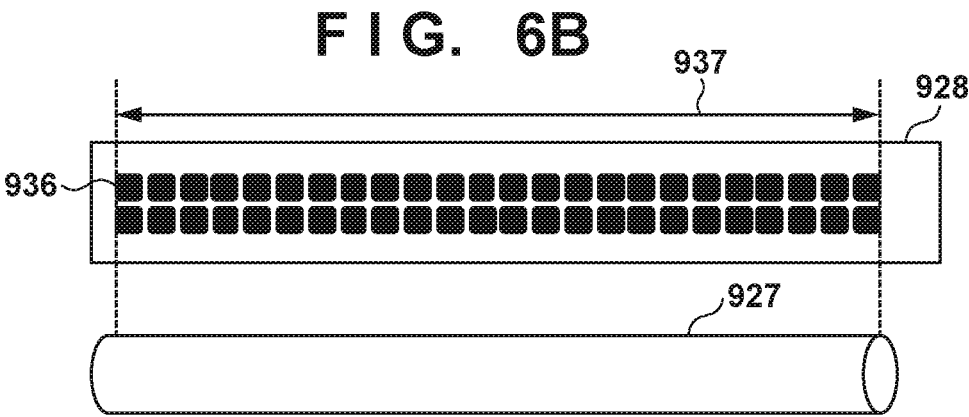
Figure 6C:
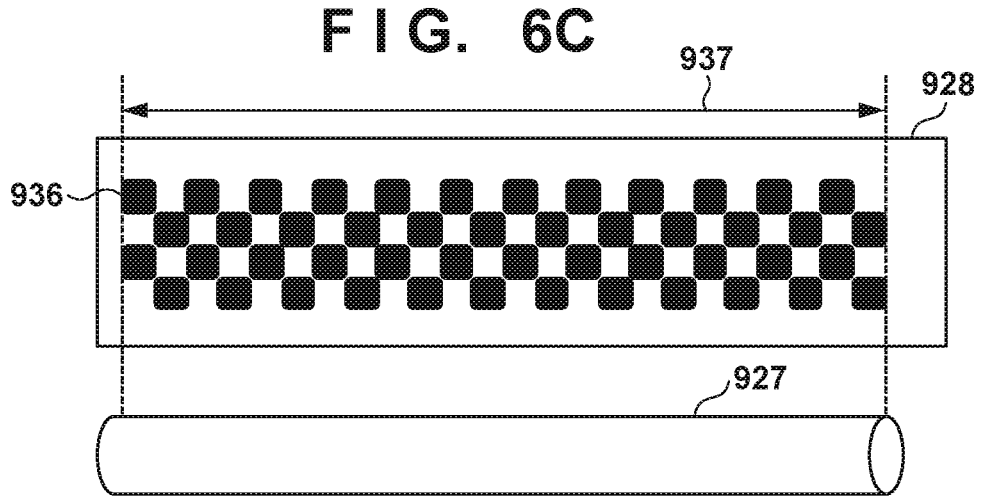

FIGS. 6A to 6C are schematic views showing an example of an image forming device using the electronic module 100 of this embodiment. An image forming device 926 shown in FIG. 6A includes a photosensitive member 927, an exposure light source 928, a developing unit 931, a charging unit 930, a transfer device 932, a conveyance unit 933 (a conveyance roller in the arrangement shown in FIG. 6A), and a fixing device 935.

Light 929 is emitted from the exposure light source 928. and an electrostatic latent image is formed on the surface of the photosensitive member 927. The electronic module 100 can be applied to the exposure light source 928. The developing unit 931 can function as a developing device that includes a toner or the like as a developing agent and applies the developing agent to the exposed photosensitive member 927. The charging unit 930 charges the photosensitive member 927. The transfer device 932 transfers the developed image to a print medium 934. The conveyance unit 933 conveys the print medium 934. The print medium 934 can be, for example, paper or a film. The fixing device 935 fixes the image formed on the print medium.

Each of FIGS. 6B and 6C is a schematic view showing a form in which a plurality of light emitting units 936 are arranged in the exposure light source 928 along the longitudinal direction of a long substrate. The electronic module 100 can be applied to each of the light emitting units 936. That is, the plurality of pixels arranged in the pixel region 153 are arranged along the longitudinal direction of the substrate 151. A direction 937 is a direction parallel to the axis of the photosensitive member 927. This column direction matches the direction of the axis upon rotating the photosensitive member 927. This direction 937 can also be referred to as the long-axis direction of the photosensitive member 927.

FIG. 6B shows a form in which the light emitting units 936 are arranged along the long-axis direction of the photosensitive member 927. FIG. 6C shows a form, which is a modification of the arrangement of the light emitting units 936 shown in FIG. 6B, in which the light emitting units 936 are arranged in the column direction alternately between the first column and the second column. The light emitting units 936 are arranged at different positions in the row direction between the first column and the second column. In the first column, the plurality of light emitting units 936 are arranged apart from each other. In the second column, the light emitting unit 936 is arranged at the position corresponding to the space between the light emitting units 936 in the first column. Furthermore, in the row direction, the plurality of light emitting units 936 are arranged apart from each other. The arrangement of the light emitting units 936 shown in FIG. 6C can be referred to as, for example, an arrangement in a grid pattern, an arrangement in a staggered pattern, or an arrangement in a checkered pattern.

Figure 7:
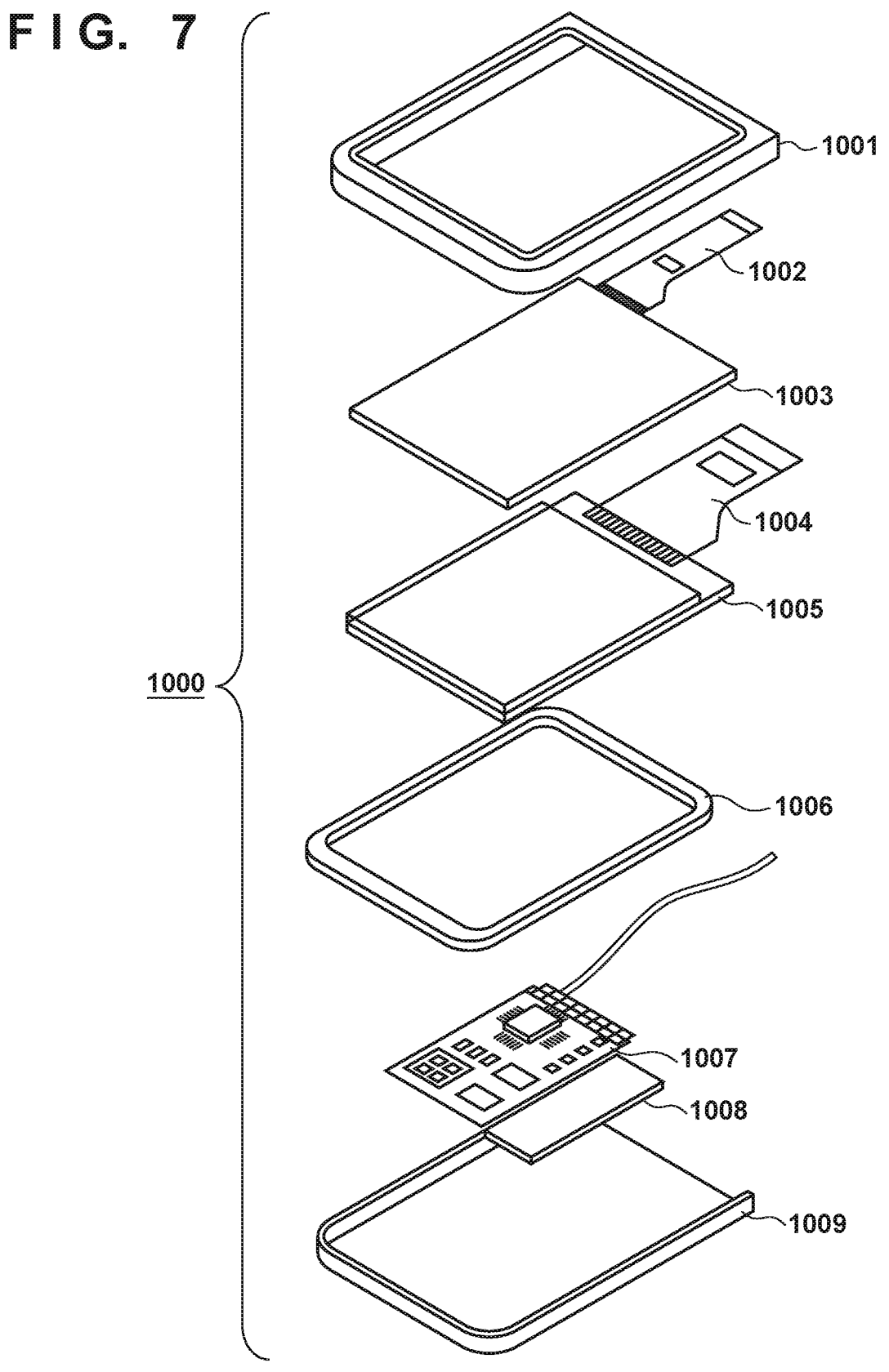

FIG. 7 is a schematic view showing an example of the display device using the electronic module 100 of this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The batter 1008 is unnecessary if the display device 1000 is not a portable apparatus. Even when the display device 1000 is a portable apparatus, the battery 1008 need not be provided at this position. The electronic module 100 can be applied to the display panel 1005. The pixels arranged in the pixel region 153 of the electronic module 100 functioning as the display panel 1005 are connected to the active elements such as transistors arranged on the circuit board 1007 and operate.

The display device 1000 shown in FIG. 7 can be used for a display unit a photoelectric conversion device (image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

Figure 8:
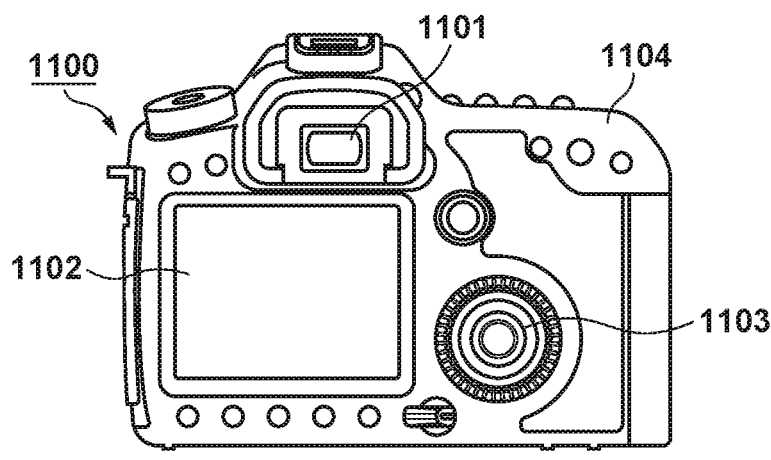
FIG. 8 is a view showing an example of a photoelectric conversion device using the electronic module according to the embodiment.

FIG. 8 is a schematic view showing an example of the photoelectric conversion device using the electronic module 100 of this embodiment. A photoelectric conversion device 1100 can include a viewfinder 1101, a rear display 1102, an operation unit 1103, and a housing 1104. The photoelectric conversion device 1100 can also be called an image capturing device. The electronic module 100 according to this embodiment can be applied to the viewfinder 1101 or the rear display 1102 as a display unit. In this case, the pixel region 153 of the electronic module 100 can display not only an image to he captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so the information should be displayed as soon as possible. Therefore, the electronic module 100 in which the pixel including the light emitting element using the organic light emitting material such as an organic EL element is arranged in the pixel region 153 may be used for the viewfinder 1101 or the rear display 1102. This is so because the organic light emitting material has a high response speed. The electronic module 100 using the organic light emitting material can be used for the apparatuses that require a high display speed more suitably than for the liquid crystal display device.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The electronic module 100 may be applied to a display unit of an electronic apparatus. In this case, the display unit can have both a display function and an operation function. Examples of the portable terminal are a portable phone such as a smartphone, a tablet, and a head mounted display.

Figure 9:
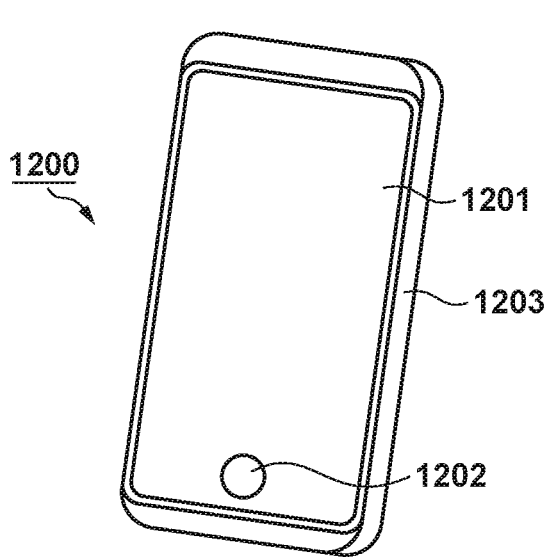
FIG. 9 is a view showing an example of an electronic apparatus using the electronic module according to the embodiment.

FIG. 9 is a schematic view showing an example of an electronic apparatus using the electronic module 100 of this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The electronic module 100 according to this embodiment can be applied to the display unit 1201.

FIGS. 10A and 10B are schematic views showing examples of the display device using the electronic module 100 of this embodiment. FIG. 10A shows a display device such as a television monitor or a PC monitor. A display device 1300 includes a frame 1301 and a display unit 1302. The electronic module 100 according to this embodiment can be applied to the display unit 1302. The display device 1300 can include a base 1303 that supports the frame 1301 and the display unit 1302. The base 1303 is not limited to the form shown in FIG. 10A, For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 10B is a schematic view showing another example of the display device using the electronic module 100 of this embodiment. A display device 1310 shown in FIG. 10B can be folded, and is a so-called foldable display device. The display device 1310 includes a first display unit 1311, a second display unit 1312, a housing 1313, and a bending point 1314. The electronic module 100 according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 11:
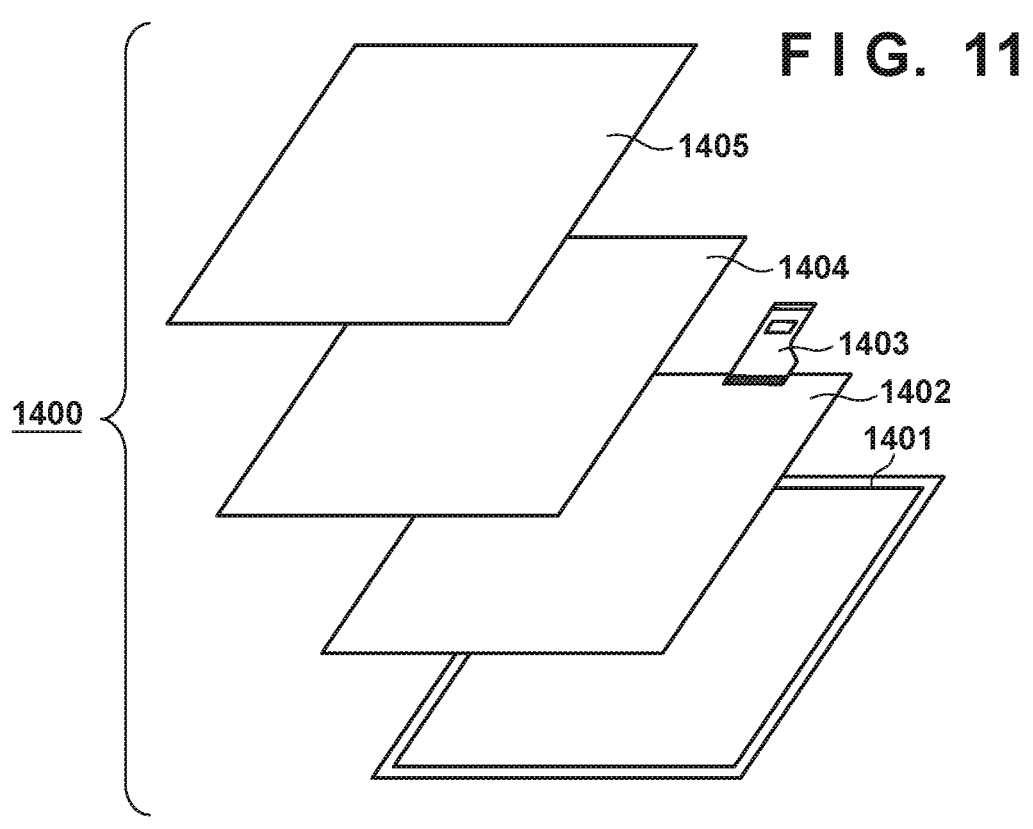
FIG. 11 is a view showing an example of an illumination device using the electronic module according to the embodiment.

FIG. 11 is a schematic view showing an example of the illumination device using the electronic module 100 of this embodiment. An illumination device 1400 can include a housing 1401, a light source 1402, a circuit board 1403, an optical film 1404, and a light diffusing unit 1405. The electronic module 100 according to this embodiment can be applied to the light source 1402. The optical film 1404 can be a filter that improves the color rendering of the light source. When performing lighting-up or the like, the light diffusing unit 1405 can throw the light of the light source over a broad range by effectively diffusing the light. The illumination device can also include a cover on the outermost portion, as needed. The illumination device 1400 can include both or one of the optical film 1404 and the light diffusing unit 1405.

The illumination device 1400 is, for example, a device for illuminating the interior of the room. The illumination device 1400 can emit white light, natural white light, or light of any color from blue to red. The illumination device 1400 can also include a light control circuit for controlling these light components. The illumination device 1400 can also include a power supply circuit connected to the pixel region 153 of the electronic module 100 functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

Figure 12:
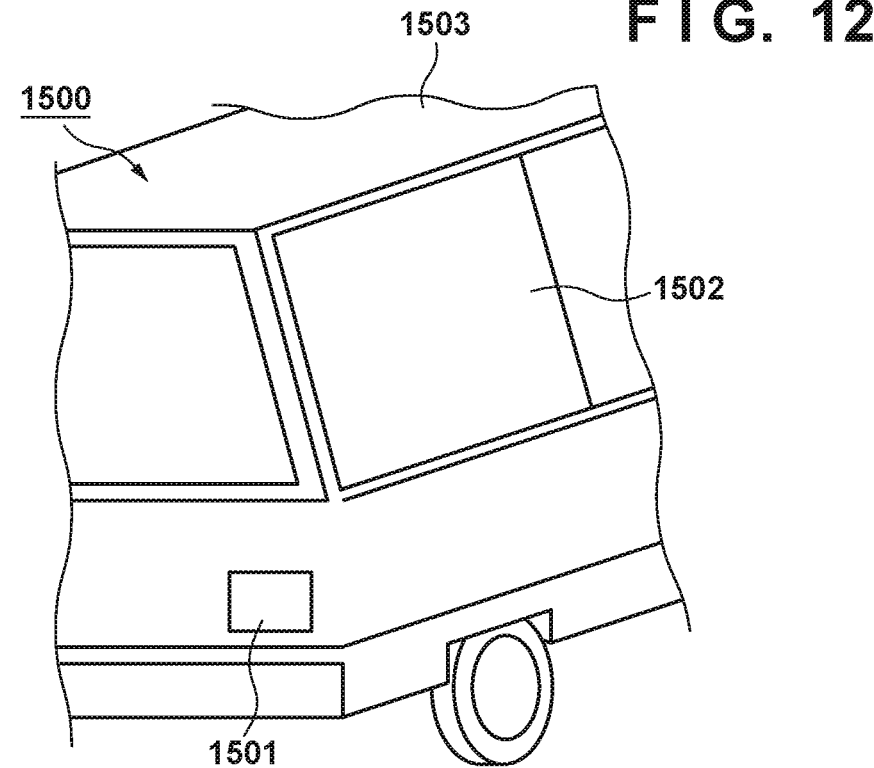
FIG. 12 is a view showing an example of a moving body using the electronic module according to the embodiment.

FIG. 12 is a schematic view of an automobile having a taillight as an example of a vehicle lighting appliance using the electronic module 100 of this embodiment. An automobile 1500 has a taillight 1501, and can have a form in which the taillight 1501 is turned on when performing a braking operation or the like. The electronic module 100 of this embodiment can be used as a headlight serving as a vehicle lighting appliance. The automobile is an example of a moving body, and the moving body may be a ship, a drone, an aircraft, a railroad car, an industrial robot, or the like. The moving body may include a main body and a lighting appliance provided in the main body. The lighting appliance may be used to make a notification of the current position of the main body.

The electronic module 100 according to this embodiment can be applied to the taillight 1501, The taillight 1501 can include a protection member for protecting the electronic module 100 functioning as the taillight 1501. The material of the protection member is not limited as long as the material is a transparent material with a strength that is high to some extent, and an example is polycarbonate. The protection member may be made of a material obtained by mixing a furandicarboxylic acid derivative, an acrylonitrile derivative, or the like polycarbonate.

The automobile 1500 can include a vehicle body 1503, and a window 1502 attached to the vehicle body 1503. This window can be a window for checking the front and back of the automobile, and can also be a transparent display. For this transparent display, the electronic module 100 according to this embodiment may be used. In this case, the constituent materials of the electrodes and the like of the electronic module 100 are formed by transparent members.

Further application examples of the electronic module 100 according to this embodiment will be described with reference to FIGS. 13A and 13B. The electronic module 100 can be applied to a system that can be worn as a wearable device such as smartglasses, a Head Mounted Display (HMD), or a smart contact lens. An image capturing display device used for such application examples includes an image capturing device capable of photoelectrically converting visible light and a light emitting device capable of emitting visible light.

Glasses 1600 (smartglasses) according to one application example will be described with reference to FIG. 13A. An image capturing device 1602 such as a CMOS sensor or an SPAD is provided on the surface side of a lens 1601 of the glasses 1600. In addition, the electronic module 100 according to this embodiment is provided on the back surface side of the lens 1601.

The glasses 1600 further include a control device 1603. The control device 1603 functions as a power supply that supplies electric power to the image capturing device 1602 and the electronic module 100 according to each embodiment. In addition, the control device 1603 controls the operations of the image capturing device 1602 and the electronic module 100. An optical system configured to condense light to the image capturing device 1602 is formed on the lens 1601.

Glasses 1610 (smartglasses) according to one application example will be described with reference to FIG. 13B. The glasses 1610 include a control device 1612, and an image capturing device corresponding to the image capturing device 1602 and the electronic module 100 are mounted on the control device 1612. The image capturing device in the control device 1612 and an optical system configured to project light emitted from the electronic module 100 are formed in a lens 1611, and an image is projected to the lens 1611. The control device 1612 functions as a power supply that supplies electric power to the image capturing device and the electronic module 100, and controls the operations of the image capturing device and the electronic module 100. The control device 1612 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center conical reflection is performed. Using pupil center conical reflection, a line-of-sight vector representing the direction (rotation angle) of the eyeball is calculated based on the image of the pupil and the Purkinje image included in the captured image of the eyeball, thereby detecting the line-of-sight of the user.

The electronic module 100 according to the embodiment of the present invention can include an image capturing device including a light receiving element, and control a displayed image based on the line-of-sight information of the user from the image capturing device.

More specifically, the electronic module 100 decides a first visual field region at which the user is gazing and a second visual field region other than the first visual field region based on the line-of-sight information. The first visual field region and the second visual field region may be decided by the control device of the electronic module 100, or those decided by an external control device may be received. In the display region of the electronic module 100, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the electronic module 100, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the electronic module 100, the image capturing device, or an external device. If the external device holds the AI program, it is transmitted to the electronic module 100 via communication.

When performing display control based on line-of-sight detection, smartglasses further including an image capturing device configured to capture the outside can be applied. The smartglasses can display captured outside information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-090384. filed Jun. 2, 2022 and Japanese Patent Application No. 2022-203533, filed Dec. 20, 2022, which are hereby incorporated by reference herein in their entirety.

What is claimed is:

1. An electronic module comprising:
an electronic device including a pixel region where pixels are arranged;
a transmissive member including a main surface facing the pixel region; and
a frame member coupled to each of the electronic device and the transmissive member, the frame member being configured to define a positional relationship between the electronic device and the transmissive member,
wherein the frame member comprises a support portion arranged to surround the transmissive member and having a support surface that supports the transmissive member,
wherein the support surface comprises a contact portion contacting the main surface and a concave portion that is depressed more than the contact portion and in which a coupling member configured to couple the transmissive member and the frame member is arranged,
wherein, as viewed in a direction orthogonal to the support surface, all of the concave portion is separated from an innermost edge of the support surface,
wherein the contact portion comprises, between the concave portion and the innermost edge of the support surface, a portion extending along an outer edge of the main surface, and
wherein a space surrounded by a wall surface of the concave portion, the coupling member, and the transmissive member is formed in the concave portion.

2. The module according to claim 1, wherein, as viewed in the direction orthogonal to the support surface, the contact portion is continuously arranged to surround the innermost edge of the support surface.

3. The module according to claim 1, wherein the coupling member contacts the main surface.

4. The module according to claim 3, wherein the coupling member further contacts a side surface, extending in a direction intersecting the main surface, of the transmissive member.

5. The module according to claim 3, wherein the coupling member does not directly contact a side surface, extending in a direction intersecting the main surface, of the transmissive member.

6. The module according to claim 1, wherein the coupling member contacts a side surface, extending in a direction intersecting the main surface, of the transmissive member.

7. The module according to claim 6, wherein the coupling member does not directly contact the main surface.

8. The module according to claim 1, wherein, as viewed in the direction orthogonal to the support surface, all of the concave portion is separated from a wall portion of the frame member that surrounds the transmissive member.

9. The module according to claim 1, wherein, as viewed in the direction orthogonal to the support surface, the concave portion contacts a wall portion of the frame member that is arranged to surround the transmissive member.

10. The module according to claim 9, wherein, as viewed in the direction orthogonal to the support surface, the concave portion contacts a wall portion, a portion of the wall portion contacting the concave portion is depressed toward an outer edge of the frame member more than a of the wall portion not directly contacting the concave portion.

11. The module according to claim 1, wherein, as viewed in the direction orthogonal to the support surface, the transmissive member covers part of the concave portion.

12. The module according to claim 1, wherein a plurality of concave portions including the concave portion are arranged on the support surface.

13. The module according to claim 1, wherein the concave portion has a depth of not less than 50 μm from the contact portion.

14. The module according to claim 1, wherein each of the pixels includes a light emitting element.

15. A display device comprising the electronic module according to claim 14, and an active element connected to the electronic module.

16. A photoelectric conversion device comprising an optical unit including a plurality of lenses, an image sensor configured to receive light having passed through the optical unit, and a display unit configured to display an image, wherein the display unit displays an image captured by the image sensor, and includes the electronic module according to claim 14.

17. An electronic apparatus comprising a housing provided with a display unit, and a communication unit provided in the housing, wherein the display unit includes the electronic module according to claim 14.

\* \* \* \* \*